United States Patent
Lachapelle et al.

(10) Patent No.: US 10,356,956 B1
(45) Date of Patent: Jul. 16, 2019

(54) DATACENTER COOLING UNIT WITH SUBFLOOR COMPONENTS

(71) Applicant: Amazon Technologies, Inc., Seattle, WA (US)

(72) Inventors: Alan Joseph Lachapelle, Reston, VA (US); Matthew Thomas Phillips, Bainbridge Island, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/746,729

(22) Filed: Jun. 22, 2015

(51) Int. Cl.
*H05K 7/20* (2006.01)

(52) U.S. Cl.
CPC ..... *H05K 7/20745* (2013.01); *H05K 7/20145* (2013.01)

(58) Field of Classification Search
CPC .................................................. H05K 7/1492
USPC .......... 361/688–695; 700/278, 276; 454/184; 165/67; 62/175
See application file for complete search history.

(56) References Cited

U.S. PATENT DOCUMENTS

| | | | | |
|---|---|---|---|---|
| 4,531,454 A | * | 7/1985 | Spoormaker | F24F 13/06 165/50 |
| 5,477,649 A | * | 12/1995 | Bessert | H02G 3/285 174/486 |
| 6,301,910 B1 | | 10/2001 | Noritake et al. | |
| 6,616,524 B2 | * | 9/2003 | Storck, Jr. | F24F 7/06 361/678 |
| 6,819,563 B1 | * | 11/2004 | Chu | G11B 33/1406 165/104.33 |
| 8,046,896 B2 | | 11/2011 | Schmitt et al. | |
| 8,154,870 B1 | | 4/2012 | Czamara et al. | |
| 8,180,495 B1 | | 5/2012 | Roy | |
| 8,320,125 B1 | | 11/2012 | Michael et al. | |
| 8,737,059 B2 | | 5/2014 | Doerrich et al. | |
| 9,629,285 B1 | | 4/2017 | Phillips et al. | |
| 2001/0029163 A1 | * | 10/2001 | Spinazzola | G06F 1/20 454/184 |
| 2004/0093879 A1 | | 5/2004 | Street et al. | |
| 2004/0217072 A1 | | 11/2004 | Bash et al. | |
| 2004/0218355 A1 | | 11/2004 | Bash et al. | |
| 2005/0225936 A1 | * | 10/2005 | Day | H05K 7/20745 361/679.47 |
| 2006/0130502 A1 | * | 6/2006 | Wruck | F24F 7/08 62/186 |
| 2006/0130504 A1 | | 6/2006 | Agrawal et al. | |
| 2007/0135032 A1 | * | 6/2007 | Wang | F24F 9/00 454/184 |
| 2007/0167125 A1 | | 7/2007 | Rasmussen et al. | |

(Continued)

OTHER PUBLICATIONS

U.S. Appl. No. 14/746,687, filed Jun. 22, 2015, Titled: Datacenter In-Row Cooling Units.

(Continued)

*Primary Examiner* — Mandeep S Buttar
(74) *Attorney, Agent, or Firm* — Kilpatrick Townsend & Stockton LLP

(57) ABSTRACT

Cooling units are configured to be installed in a datacenter, such as in a row configured to receive server racks. The cooling units include chilling coils configured to cool air passing across the chilling coil. The cooling units when installed supply cooled air and include one or more cooling unit components located beneath or installed in a raised floor of the datacenter.

20 Claims, 8 Drawing Sheets

(56) References Cited

U.S. PATENT DOCUMENTS

| | | | |
|---|---|---|---|
| 2008/0104985 A1* | 5/2008 | Carlsen | F24F 11/0009 62/228.4 |
| 2008/0285232 A1* | 11/2008 | Claassen | H05K 7/20736 361/694 |
| 2009/0150129 A1* | 6/2009 | Archibald | G06F 1/20 703/5 |
| 2009/0168345 A1 | 7/2009 | Martini | |
| 2009/0210096 A1 | 8/2009 | Stack et al. | |
| 2009/0241578 A1* | 10/2009 | Carlson | F25D 17/06 62/259.2 |
| 2010/0076607 A1 | 3/2010 | Ahmed et al. | |
| 2010/0139887 A1* | 6/2010 | Slessman | F28F 9/0265 165/67 |
| 2010/0144265 A1 | 6/2010 | Bednarcik et al. | |
| 2010/0263825 A1 | 10/2010 | Noteboom et al. | |
| 2010/0317278 A1 | 12/2010 | Novick et al. | |
| 2011/0083824 A1 | 4/2011 | Rogers | |
| 2011/0100618 A1 | 5/2011 | Carlson et al. | |
| 2011/0122561 A1 | 5/2011 | Pierson et al. | |
| 2011/0240265 A1 | 10/2011 | Dechene et al. | |
| 2011/0240497 A1 | 10/2011 | Dechene et al. | |
| 2011/0256822 A1 | 10/2011 | Carlson et al. | |
| 2011/0303406 A1 | 12/2011 | Takeda et al. | |
| 2012/0060429 A1 | 3/2012 | Reynolds et al. | |
| 2012/0065809 A1 | 3/2012 | Allard et al. | |
| 2012/0100798 A1* | 4/2012 | Bermudez | E04F 15/02405 454/338 |
| 2013/0037254 A1 | 2/2013 | Carlson et al. | |
| 2013/0163185 A1 | 6/2013 | Gilges et al. | |
| 2013/0233532 A1 | 9/2013 | Imwalle et al. | |
| 2013/0300266 A1 | 11/2013 | Ramey et al. | |
| 2014/0014292 A1 | 1/2014 | Rice et al. | |
| 2014/0157692 A1 | 6/2014 | Parizeau et al. | |
| 2014/0202678 A1 | 7/2014 | Goth et al. | |
| 2014/0240917 A1 | 8/2014 | Nicolai et al. | |
| 2014/0298839 A1 | 10/2014 | Nagamatsu et al. | |
| 2016/0037685 A1 | 2/2016 | Ross | |
| 2016/0242325 A1* | 8/2016 | Reynolds | E04F 15/02405 |

OTHER PUBLICATIONS

U.S. Appl. No. 14/746,714, filed Jun. 22, 2015, Titled: Interconnecting Cooling Units.

* cited by examiner

DATACENTER COOLING UNIT WITH SUBFLOOR COMPONENTS

This application is related to and incorporates by reference for all purposes the full disclosure of co-pending U.S. patent application Ser. No. 14/746,687, filed Jun. 22, 2015, entitled "DATACENTER IN ROW COOLING UNITS", and co-pending U.S. patent application Ser. No. 14/746,714, filed Jun. 22, 2015, entitled "INTERCONNECTING COOLING UNITS", the contents of which are herein incorporated in their entireties.

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a large part of the cost of operating a datacenter is related to the datacenter's cooling systems and the total electricity cost. Accordingly, to limit costs from excessive cooling, a space within a datacenter will typically have cooling systems with a maximum capacity corresponding to the heat load expected to be produced by the equipment within that space. However, if the heat load exceeds the expectation (e.g., due to incorrect assumptions about the equipment or due to a later change to equipment that produces a greater heat load), the existing cooling systems may be inadequate and there may be insufficient room where the cooling systems are located to permit expansions to add capacity. This may require the removal of servers until enough heat load is removed that the total heat load is within the capacity of the existing cooling systems and/or may cause other negative effects on the overall operations of the datacenter.

BRIEF DESCRIPTION OF THE DRAWINGS

Various embodiments in accordance with the present disclosure will be described with reference to the drawings, in which.

DETAILED DESCRIPTION

Figure 1:
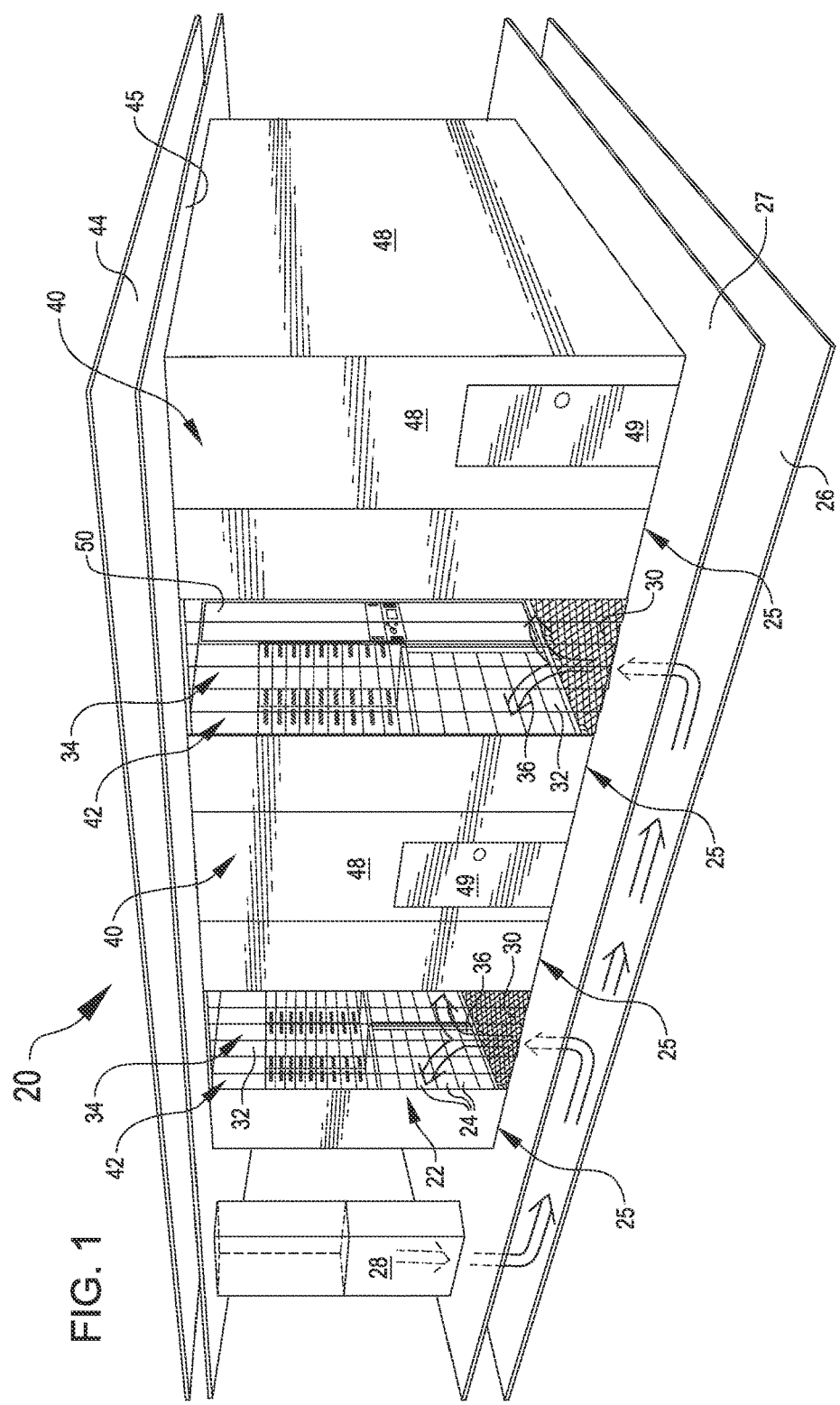
FIG. 1 is a perspective view of a datacenter incorporating in-row cooling units in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to in-row cooling units for a datacenter. Such units can be installed in a row arranged to receive a server rack (e.g., in a position where servers have been removed to reduce a heat load on a space in a datacenter), such as to provide an additional source of cooled air for addressing heat loads in the datacenter.

In various embodiments, the in-row cooling units are used in a datacenter that includes internal walls or other structures that form separations between one or more hot and cold zones, or aisles. The cold aisle or aisles are used for providing cool air for the servers and/or network hardware and for access by workers or administrators. The hot aisle or aisles receive heat exhausted from servers and/or networking hardware within the datacenter. This heat is exhausted out of the datacenter by fans and/or natural convention currents that occur in the datacenter.

To aid in air flow, computing devices are arranged so that they draw air from a cold aisle and exhaust air into a hot aisle. For example, servers are mounted in the datacenter so that a front portion, including intake vents for cooling, faces and is exposed to a cold aisle of the datacenter. A rear portion, including an exhaust fan, faces a hot aisle of the datacenter. In this manner, the server is cooled by drawing cold air from the cold aisle and the air that is heated by the server is exhausted into the hot aisle. The servers or racks for the servers can be mounted so that they extend through a structure that separates a cold aisle and a hot aisle.

In a similar manner, networking hardware can be mounted so that air intake is exposed to the cold aisle, with exhaust fans exposed to a hot aisle. Because typical networking hardware includes exhaust on a side and intake on an opposite side, the networking hardware racks are typically turned sideways so that the intake is exposed to the cold aisle for drawing cold air, and the exhaust side is exposed to the hot aisle, permitting hot air from the networking hardware to blow into the hot aisle.

In operation, the cooling fans of the networking hardware draw cool air from a cold aisle and exhaust hot air into a hot aisle. Similarly, the fans for the servers draw air from a cold aisle into a hot aisle. Thus, the standard cooling structures supplied for servers and networking hardware provide air flow from the cold aisles, through the equipment, and into the hot aisles.

The hot air in the hot aisles, via natural convection currents, flows to the top of the datacenter, and can be vented out of the datacenter. Cool air can be provided to the cold aisles by drawing air from outside the datacenter into the cold aisle, and/or from conditioned air being supplied to the cold aisle, for example from chillers. The chillers may correspond, for example, to in-row cooling units described herein and/or to computer room air handling units located around a periphery of—or remote from—a room with the hot and cold aisles. Fans may be provided to enhance convention flow.

In-row cooling units herein utilize structural hardware pieces to fit in a row alongside and/or within a profile or footprint of a server rack or a network hardware rack. As used herein in the specification and claims, "server rack" is utilized to mean either a server rack or a network hardware rack, to avoid having to repeat both throughout the description. As described above, network racks are typically turned sideways, and may require some spacing between network hardware racks for technician access, whereas servers exhaust out a back exhaust fan, and thus server racks can be installed immediately adjacent to one another. The differentiation in these two structures can require some alterations to the in-row cooling unit structures below, but in general, embodiments herein can utilize the same structure of in-row cooling units for a row accommodating a server rack as for a row accommodating a network hardware rack.

In various embodiments, an in-row cooling unit includes a fan and a chilling coil, for example, a chilled water coil. The fan moves air across the chilling coil, and heat is transferred from the air to the chilling coil to produce cooled air. The amount of heat that is transferred is dependent in part on the amount of surface area of the chilling coil that is positioned in the path of the moving air. For a known surface area, the temperature and/or amount of the cooled air produced can generally be controlled by adjusting the speed of the fan and/or the flow rate of coolant through the chilling coil, such as by throttling a supply valve to the chilling coil. Filters may be provided to prevent airborne particulate from reaching or fouling other components, such as the chilling coil and/or the fan.

In various embodiments, the in-row cooling unit is arranged to move air from a top to a bottom, for example, to receive air in the top and exhaust cool air out the bottom after passing by the chilling coil. This may include moving air from or through a hot air plenum located above a ceiling and/or moving cooled air through a floor, such as for transfer into the cold aisles through a cold air plenum below the floor. The in-row cooling unit may extend in height above a height of server racks, which may permit the use of chilling coils with larger amounts of surface area and a corresponding greater amount of cooling. In some embodiments, the in-row cooling unit extends at least to the ceiling.

In some embodiments, the in-row cooling unit includes components located underneath the floor when the in-row cooling unit has been installed. For example, the fan and/or a supply valve for the chilling coil can be below the floor. Such placement may prevent such components from occupying space that could otherwise be used to accommodate further surface area of the chilling coil. In some embodiments, the components of the in-row cooling unit are arranged to engage or fit with an existing floor grid of a raised floor so that the in-row cooling unit can be installed without modification to the grid.

In some embodiments, in-row cooling units can interlock or couple together into a system to expand the capacity beyond that of an individual in-row cooling unit. The interconnected in-row cooling units may form a shared inner volume through which air passes for cooling. Coupling the in-row cooling units together may permit redundant pieces to be eliminated, thereby reducing cost. For example, the whole assembly may utilize one set of side panels instead of individual side panels for each individual unit. In some embodiments, one or more in-row cooling units are coupled with a primary in-row cooling unit that controls the cooling provided by the assembly. Such a master-slave configuration may reduce a total number and/or complexity of control components in the system, which may reduce costs of production and/or yield other operational efficiencies.

Referring now to the drawings, in which like reference numerals represent like elements throughout the several views, FIG. 1 shows a datacenter 20 in accordance with embodiments. The datacenter 20 includes several server racks 22 (FIG. 2) having servers 24 mounted therein. Although the servers 24 are diagrammatically shown as rectangles in the drawings, the servers may fill only portions of the rack, as is known. As described above, the server racks 22 may alternatively include network hardware equipment, not shown.

The datacenter 20 includes a cooling flow defining hot and cold aisles, as described above. In various embodiments shown in the drawings, a cold air plenum 26 is attached to a cold air supply 28, which may be, for example, chillers, air conditioning, outside air venting, computer room air handling units, and/or other cool air supply. The cold air supply 28 is located at a periphery of a room of the datacenter 20, as is typical to allow as much space as possible in a climate-controlled space to be used for servers 24.

Air from the cold air plenum 26 flows through vents 30 in the floor 27 of the datacenter 20. The air that flows through the vent 30 flows into a cold aisle 34 for the datacenter. In various embodiments, chilled air in the cold aisle 34 can be contained by a cold air containment system, which may be, for example, air curtains 32. The cold air containment system (e.g., the curtains 32) prevents flow of the chilled air out of the cold aisle 34. As shown by the arrows 36, cold air from the cold air plenum 26 flows out of the vents 30 and into the server racks 22. This flow may be provided, for example, by the fans that are provided on the servers 24 or other network hardware equipment, as described above.

Figure 2:
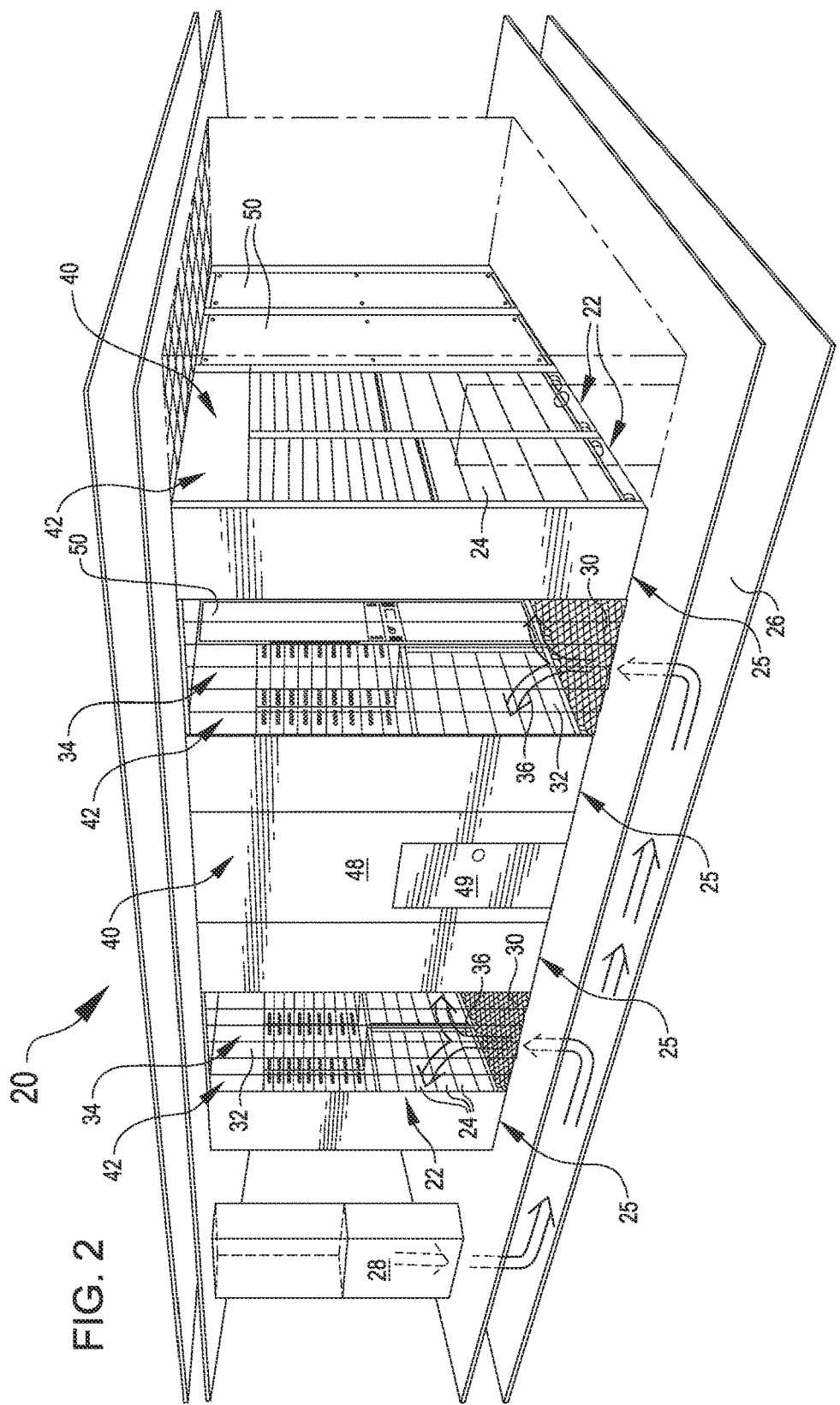
FIG. 2 is a perspective view of the datacenter of FIG. 1, with parts removed to show detail.

Hot aisles 40 are also provided in the datacenter 20. In FIGS. 1 and 2, the hot aisles 40 are enclosed structures, and part of the wall for the far right hot aisle in FIG. 2 is removed to show detail. As described above, these hot aisles 40 are isolated from the cold aisles 34 by the server racks 22 and the cold air containment system, in the example shown, the air curtains 32. In addition, in accordance with embodiments, a hot aisle containment structure 42 is provided for containing the hot air in the hot aisle and directing that air to a hot air plenum 44 in or above the ceiling 45 of the datacenter 20.

The hot aisle containment structure 42 includes structures that are assembled to seal the area around the back end of the server racks 22 in the datacenter 20. The hot aisle containment structure 42 prevents the flow of hot air exhausting from the servers 24 back toward the cold aisle 34 or other parts of the datacenter 20. Although the hot aisle containment structure 42 is shown in FIGS. 1 and 2 as solid panels, in some embodiments, it may additional or alternatively include flexible structures such as curtains similar to the air curtains 32. In various embodiments, the hot aisle is enclosed by additional structures, such as walls 48 at the ends of the hot aisle. As shown in FIG. 1, such walls can enclose one side of a hot aisle 40 at the end of the datacenter 20. Doors 49 can be provided for access into the hot aisle 40.

Rows 25 are also defined in the datacenter 20. The rows 25 correspond to the space occupied by the server racks 22 when installed and/or the space designated for receiving the server racks 22 for installation. The rows 25 shown in FIGS. 1 and 2 provide at least part of the separation between the hot aisles 40 and the cold aisles 34 of the datacenter 20.

As described above, the cooling capacity of the cold air supply 28 is generally determined based on the initial heat load expected from the servers 24 specified at the time the datacenter 20 is launched, and it is often impracticable to expand capacity through the supply 28 once the datacenter 20 is constructed. As such, the datacenter 20 includes in-row cooling units 50. The in-row cooling units 50 provide an additional source of cooled air, for example, using components described in more detail below, e.g., with respect to FIG. 4 etc. This additional source of cooled air can supplement and/or replace the cooled air provided by the cold air supply 28, and in some embodiments the cold air supply 28 may be entirely omitted in lieu of one or more in-row cooling units 50. The in-row cooling units 50 are generally installed in the rows 25 for the server racks 22, for example, in place of one or more of the server racks 22. In some embodiments, the in-row cooling units 50 are installed into spaces in the rows 25 that would otherwise be empty from server racks 22 being removed or having never been installed due to insufficient cooling capacity from the cold air supply 28. These in-row cooling units 50 thus fit in unutilized space in the rows 25 and provide an amount of additional cooling capacity that may be sufficient to allow additional server racks 22 to be added in the rows 25 in other space that would be otherwise unutilized too. However, although termed "in-row" cooling units 50 herein due to their particular suitability to being installed in rows 25 for server racks 22, it should also be appreciated that at least some embodiments of the in-row cooling units 50 are not limited to installation in rows 25, but additionally or alternatively may be installed in other locations, such as in other available space apart from the rows 25.

Figure 3:
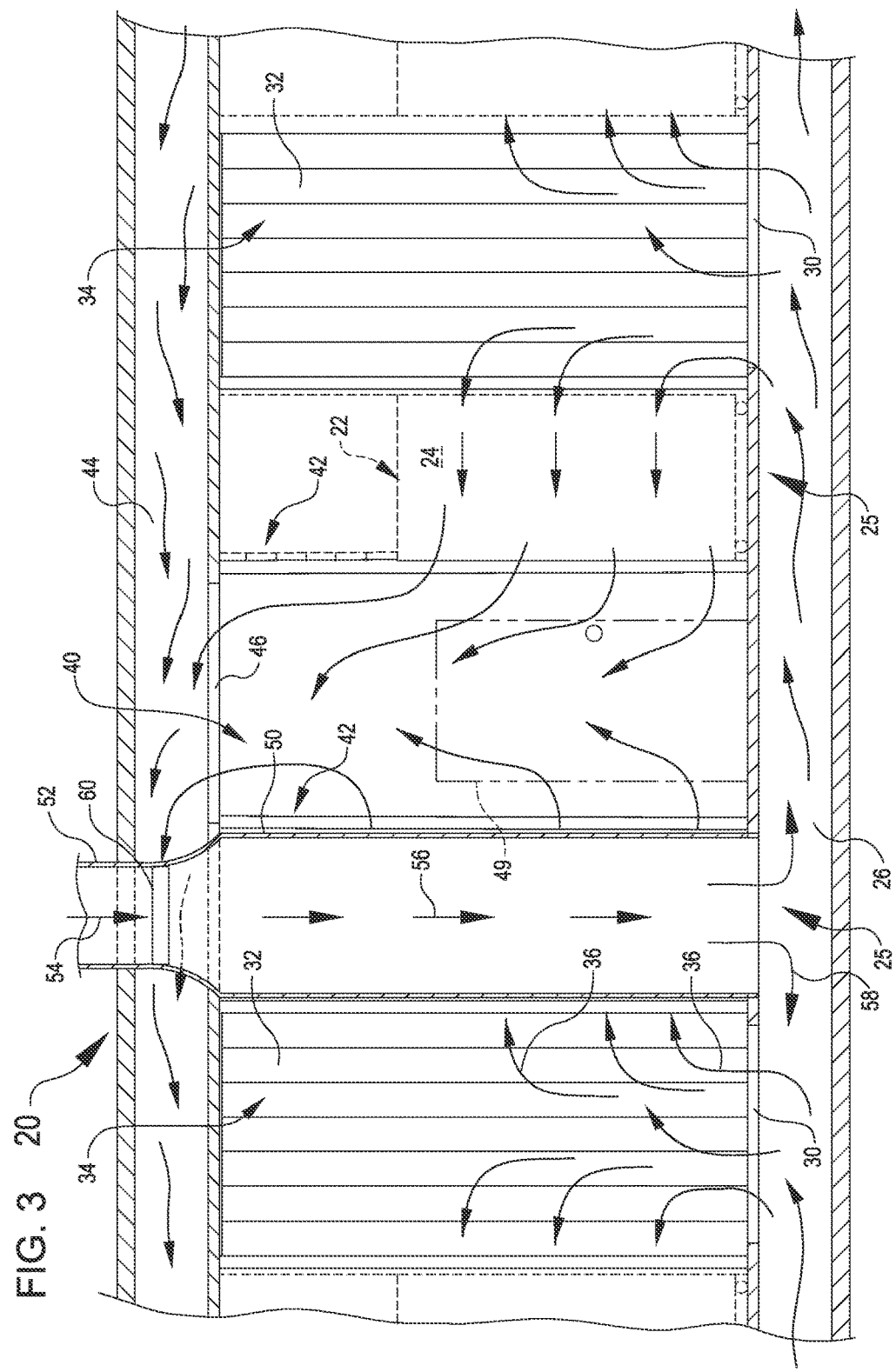
FIG. 3 is a diagrammatic representation of air flow through the datacenter of FIG. 1.

FIG. 3 is a diagrammatic representation of air flow in the datacenter 20 in accordance with embodiments. As can be seen, air flows from the cold air plenum 26, up through the grates 30 and into the cold aisles 34. The chilled air is drawn through the servers 24 in the server racks 22 and is exhausted by the servers into the hot aisle 40. (Although this flow may be best understood with reference to the cold aisle on the right side of FIG. 3, this flow is also shown with respect to the cold aisle on the left side of FIG. 3, e.g., through servers positioned into or out of the page in the row 25 with the in-row cooling unit 50, yet which are not illustrated so as to not obstruct the details of the in-row cooling unit 50 shown in FIG. 3). The air is heated as it cools the servers 24, and thus is warm or hot when it enters the hot aisle 40. The heated air then exits the hot aisle 40 and flows through vents 46 into the hot air plenum 44. The hot aisle containment structure 42 and the air curtains 32 (or other cold air containment systems) prevent or limit the flow of air along other flow paths than those just described.

The in-row cooling units 50 provide an additional source of cooled air into the airflow through the datacenter 20. In the embodiment shown in FIG. 3, the in-row cooling unit receives air (e.g., illustrated at arrow 54), cools the air as it passes through the in-row cooling unit 50 (e.g., as illustrated by arrow 56), and introduces the cooled air into the cold air plenum 26 (e.g., as illustrated by arrow 58). In some embodiments, the in-row cooling unit 50 receives air through a duct 52 or other structure in communication with an air source remote from the hot air plenum 44, such as an outside air economizer of the sort used by other chillers or the cold air supply 28. A mixing box 60 or other mixing structure may be provided to mix air from the hot air plenum 44 with air received through the duct 52. In some embodiments, the mixing box 60 can selectively adjust a ratio between air received from the hot air plenum 44 and air received through the duct 52 from the source beyond the hot air plenum. Although the mixing box 60 shown in FIG. 3 is located in the duct 52, the mixing box 60 may be located in any suitable location when the in-row cooling unit 50 is installed, including below the ceiling and/or in the main body of the in-row cooling unit 50. In some embodiments, the duct 52 may be omitted and the in-row cooling unit 50 may receive air directly from the hot air plenum 44.

Cooled air from the in-row cooling unit 50 in FIG. 3 is provided through the floor into the cold air plenum 26, from which the flow can provide cooling for servers 24 in any row 25 of the data center. In this way, the in-row cooling unit 50 can provide cool air to servers 24 in the same row 25 as the in-row cooling unit 50 and/or in rows 25 apart from the in-row cooling unit 50. For example, as shown in FIG. 3, air from the in-row cooling unit 50 may travel through the cold air plenum 26 and into the cold aisle 34 on the left side of FIG. 3 or into the cold aisle 34 on the right side of FIG. 3.

Figure 4:
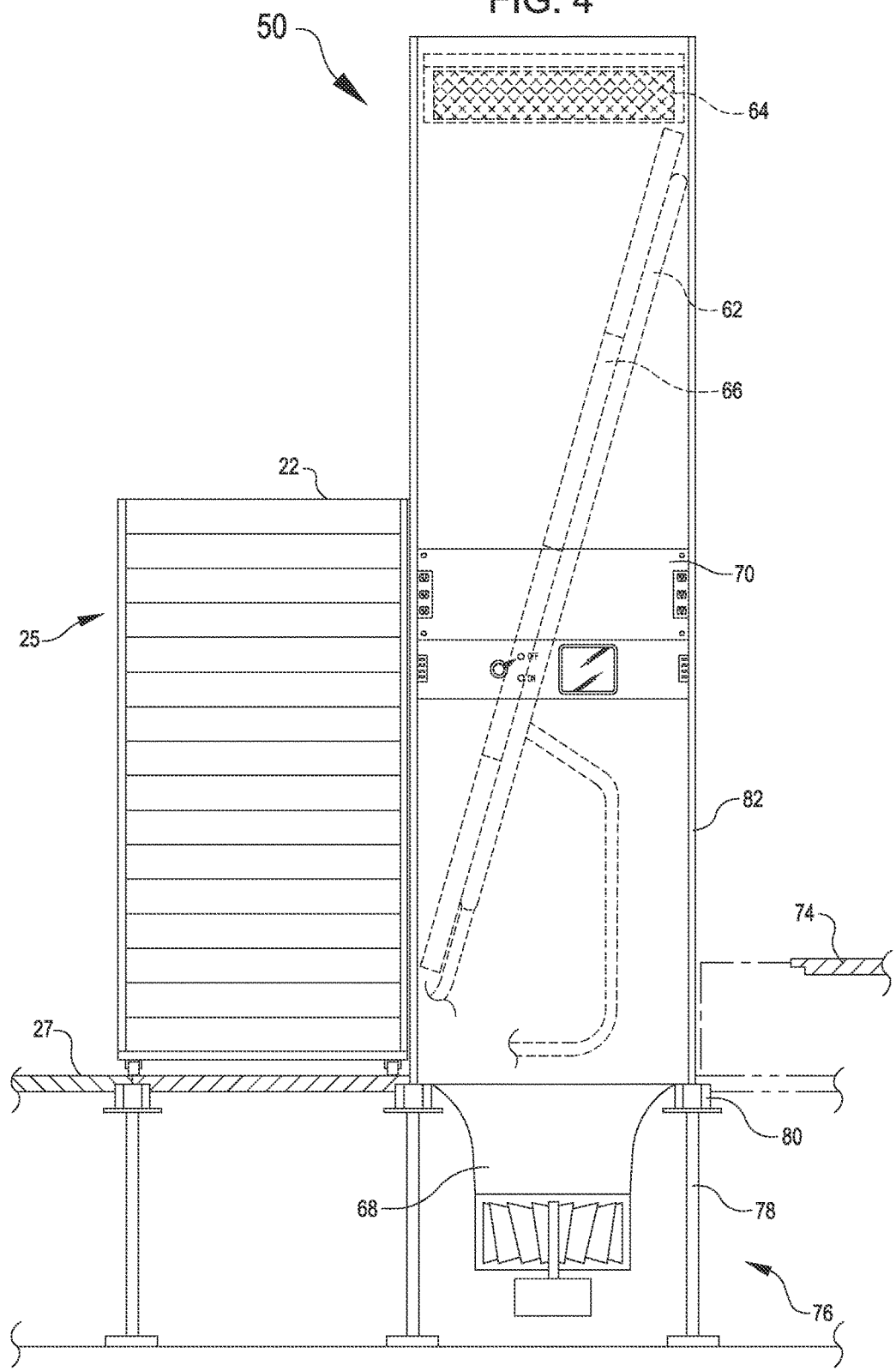
FIG. 4 is a front view of an in-row cooling unit installed in a raised floor of a datacenter in accordance with embodiments.
Figure 5:
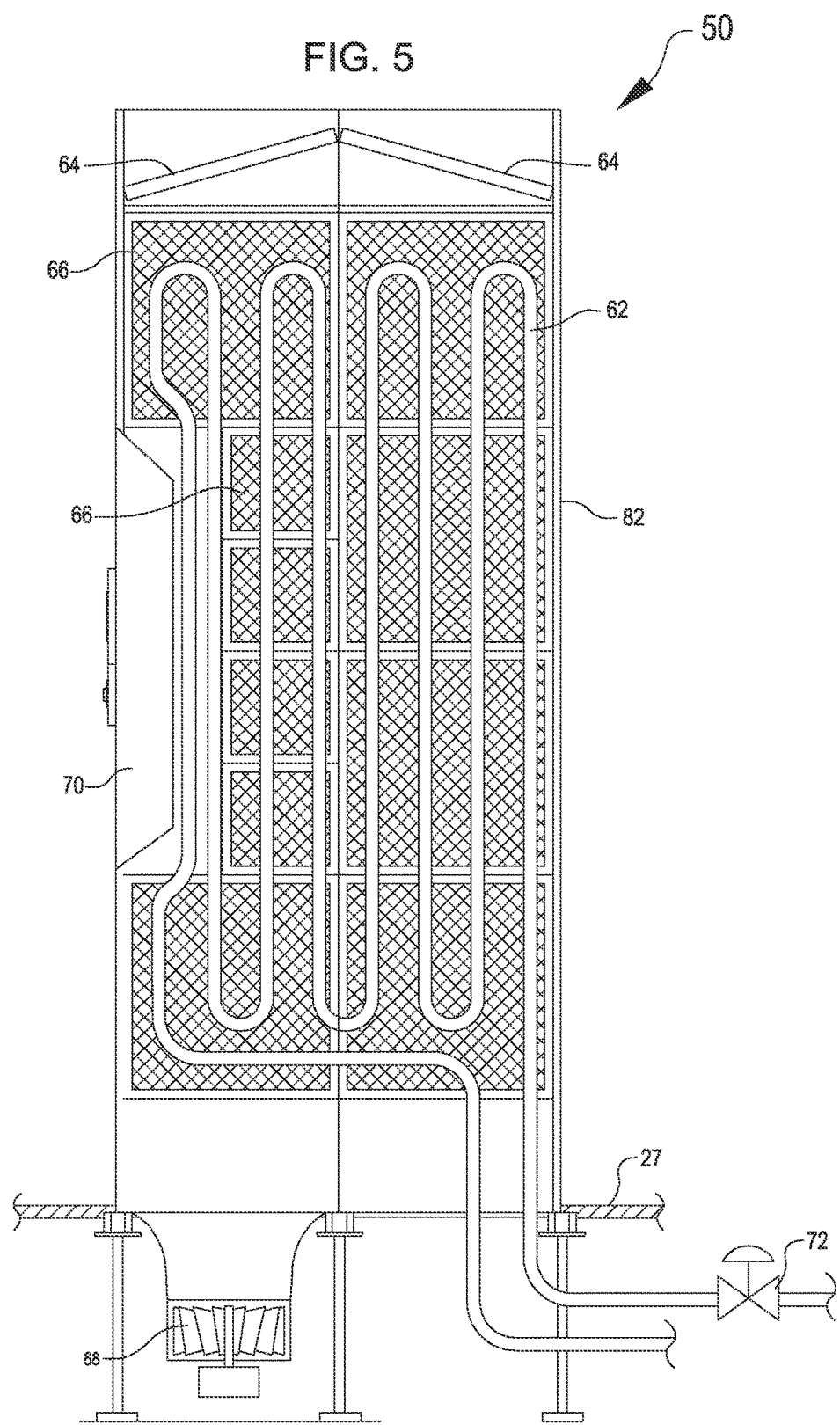
FIG. 5 is right side view of the in-row cooling unit of FIG. 4.

FIGS. 4 and 5 illustrate additional details of an in-row cooling unit 50. A frame 82 defines the main body of the in-row cooling unit 50. The frame 82 can be sized to fit within a particular footprint, for example a 24 inch by 24 inch footprint, a 24 inch by 48 inch footprint, or any other footprint of a standardized server rack 22. However, the frame 82 is not limited to fit within completely within a standard profile of a server rack 22. In various embodiments, a height of the frame 82 is greater than a height of a standard server rack 22. For example, whereas the server rack 22 in FIGS. 4 and 5 are limited in height (e.g., to facilitate ease of maintenance to components therein by technicians), the frame 82 need not be so limited. Indeed, the frame 82 in FIGS. 4 and 5 is taller than the server rack 22 and may extend upward toward or through the ceiling 45 and/or downward toward or through the floor 27.

The in-row cooling unit 50 includes a chilling coil 62 that transfers heat out of the air being passed through the in-row cooling unit 50. In various embodiments, the chilling coil 62 is a chilled water chilling coil that uses chilled water as a coolant; however, other coolants may also be used. Various types of chilling coil 62 can be used, including direct exchange evaporators, cooling towers, or any other mechanism used for commercial refrigeration or cooling. Additionally, in some embodiments, the chilling coil 62 may be replaced with a direct evaporative cooling apparatus, e.g., of a fill-type or fog-type. A supply valve 72 regulates the flow of coolant through the chilling coil 62, such as to adjust an amount of cooling provided by the in-row cooling unit 50.

The illustrated chilling coil 62 extends in height above a height of a server rack 22 in a row 25 in which the in-row cooling unit 50 is installed. Such a larger height of the chilling coil 62 utilizes a vertical space that is typically not utilized. The larger height also provides a larger surface area for contact of air passing through the in-row cooling unit 50.

The chilling coil 62 may be slanted within the in-row cooling unit 50. For example, the chilling coil 62 is illustrated slanted from bottom to top and left to right in FIGS. 4 and 5; however other slants and/or orientations may also be used. In some embodiments, the chilling coil 62 is arranged with a slant that is selected based on a resulting surface area of the chilling coil, e.g., to fit as much surface area as possible within the profile of the in-row cooling unit 50. Although the chilling coil 62 is shown as arranged substantially in a plane, other arrangements, (including but not limited to curved, bent, angled, and/or otherwise contoured) can be used in other embodiments. Additionally, in some embodiments the chilling coil 62 is oriented completely vertically or is otherwise not slanted.

Filters can be provided in the in-row cooling unit 50. For example, in the embodiment shown in FIGS. 4 and 5, a first set of filters 64 is provided at or near an intake of the in-row cooling unit 50, e.g., at the top of the in-row cooling unit 50. A second set of filters 66 is provided along the chilling coil 62. The second set of filters 66 is shown made up of different standardized sizes (such as 12 inch by 12 inch, or 24 inch by 24 inch, although other sizes may be used). Using readily available standardized sizes may reduce costs of producing and/or maintaining the in-row cooling unit 50. Although the in-row cooling unit 50 is shown with a first set of filters 64 at an entrance and a second set of filters 66 along the chilling coil 62, the in-row cooling unit 50 may include any appropriate number and/or arrangement of filters, including more or fewer filters and/or sets of filters than shown. Additionally, any set of filters can have any suitable number and arrangement of filters, including just one filter, which in some embodiments may be shaped to fit around and/or with components of the in-row cooling unit 50.

Air is moved through the in-row cooling unit 50 by a fan 68. The fan can be located at any suitable location, including in an exhaust at or near a bottom of the in-row cooling unit 50. In the embodiment shown in FIG. 4, the fan 68 is located below a raised floor 27 of the data center 20 when installed.

A control module 70 controls the amount of cooling provided by the in-row cooling unit 50. For example, the control module 70 may control the fan 68 and/or the supply valve 72 to the chill water coil 62 to control the temperature and/or amount of the cooled air produced by the in-row cooling unit 50. The control module 70 is shown substantially flush with a front of the in-row cooling unit 50, such as to avoid outward projections from the in-row cooling unit 50 that might snag and/or collide with operators and/or equipment moved along the row 25. In some embodiments, the chilling coil 62 can be shaped to fit around the control module 70

In some embodiments, the in-row cooling unit 50 has components that extend below the floor 27 when the in-row cooling unit 50 has been installed. For example, the fan 68 and/or the supply valve 72 are both shown in FIG. 5 as positioned beneath the floor 27. Such placement may permit extra room in the in-row cooling unit 50 for additional surface area of the chilling coil 62. Although the supply valve 72 is shown as positioned behind the installed in-row cooling unit 50, in some embodiments, the supply valve 72 may be positioned elsewhere relative to the in-row cooling unit 50, such as in front of or within the in-row cooling unit 50. As such, the supply valve 72 may be positioned underneath a hot aisle 40 or underneath a cold aisle 34.

In some embodiments, the in-row cooling unit 50 can be installed into an existing data center 20 without significant modification to the infrastructure of the data center 20. In the embodiment shown in FIGS. 4 and 5, the floor 27 is a raised floor formed of tiles 74 supported by a grid 76. The grid 76 includes pedestals 78 and stringers 80. The stringers 80 extend between individual pedestals to provide structural outlines on which the tiles 74 rest. The illustrated tiles 74 have edge portions that extend over the top of the stringer 80 and body portions that extend down along the side of the stringer 80. In the illustrated arrangement, the edge portions of the tiles 74 abut one another over the stringers 80 to form a smooth floor surface. However, other raised floor systems may be used too. For example, the body portions of the tiles 74 may extend the whole height of the stringers 80 so that the tiles 74 rest on both the stringers 80 and the pedestals 78. In other arrangements, the edge portions may be omitted and tiles 74 may rest directly on top of the pedestals and in between the stringers 80 so that the floor 27 is a relatively flush surface along the tops of the tiles 74 and the stringers 80.

For installation of the in-row cooling unit 50 of FIGS. 4 and 5, one or more floor tiles 74 can be removed from the floor 27 to expose a part of the grid 76. Any parts of the in-row cooling unit 50 that are to be positioned below the floor 27 can be lowered through the grid 76. As may be appreciated from FIGS. 4 and 5, the fan may be sized so as to fit between pedestals 78 and/or stringers 80 of the grid 76 during installation. A frame 82 of the in-row cooling unit 50 is installed to rest on the exposed portion of the grid 76, such as on the stringers 80 (as shown) and/or on the pedestals 78. When fully installed, the frame 82 of the in-row cooling unit 50 may rest on the grid 76 without intervening floor tiles 74. The fully installed in-row cooling unit 50 may extend from below the floor 27 and/or above the ceiling 45.

In some embodiments, the in-row cooling units 50 can be installed modularly or in sections, e.g., as separate interconnectable pieces. As an illustrative example, a technician may install the fan 68 by situating it relative to the grid 76, install the supply valve 72 as a separate piece, and bring the chilling coil 62 (e.g., within the frame 82) over and place it above the fan 68 and supply valve 72. This may allow the fan 68 to be connected with a wiring harness or other connection for power and/or control, such as to a control module 70 in the frame 82 or in another unit. Installation may also include the supply valve 72 valve being connected with the chilling coil 62, such as by using known leak-free quick disconnects with integral ball check valves. In some embodiments, the control module 70 is also a modular unit that is easily replaceable, e.g., to facilitate maintenance or modification of the functionality of the in-row cooling unit 50, such as to change it between a master in-row cooling unit 98 and a slave in-row cooling unit 100 (which are described in more detail with respect to FIG. 7-9 below).

Figure 6:
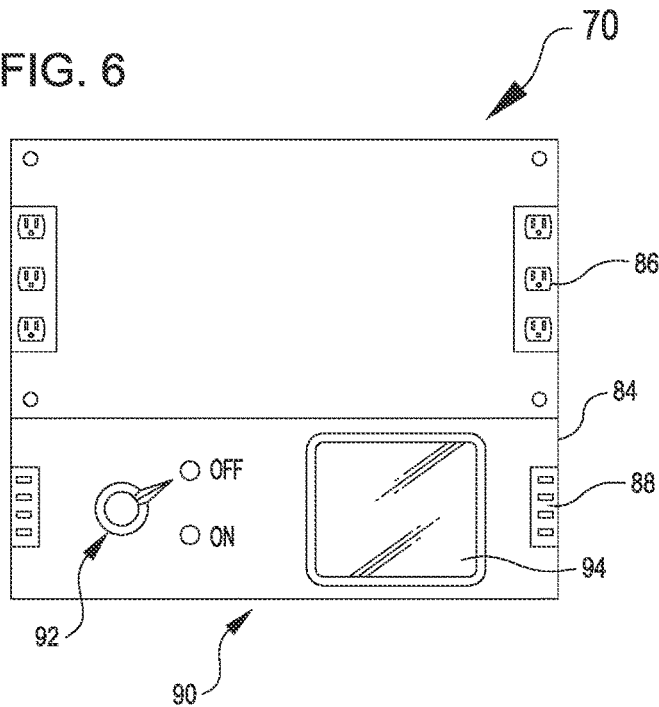
FIG. 6 is a detail view of a control panel for a cooling unit in accordance with embodiments.

FIG. 6 illustrates a control panel 84 of a control module 70. The control panel 84 includes power connections 86, data connections 88, and a user interface 90. A user interface can include elements such as a switch 92 and/or touch screen 94 that a user may operate in order to control operation of the in-row cooling unit 50 and/or operation of other components linked with the in-row cooling unit 50. In some aspects, the control panel 84 may be utilized to control operations of other in-row cooling units which will be described with respect to FIGS. 7-9. The power connections 86 and/or data connections 88 can be used to couple the in-row cooling unit 50 with other units, such as by cables or physical engagement between respective connection structures.

Figure 7:
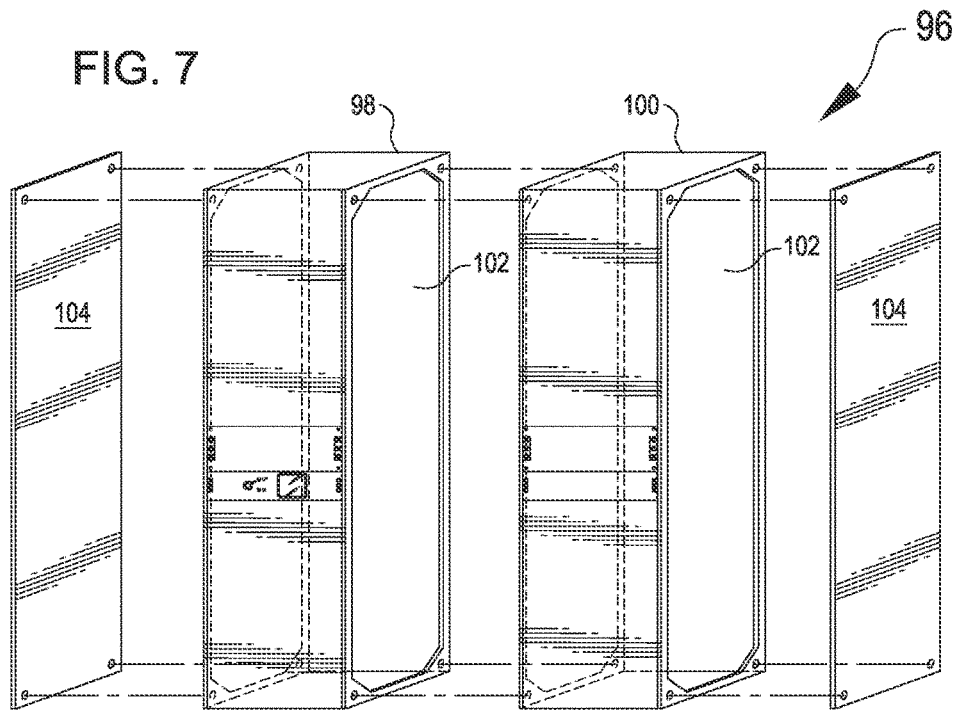
FIG. 7 is an exploded perspective view of an in-row cooling system with a master in-row cooling unit and a slave in-row cooling unit in accordance with embodiments.

The in-row cooling unit 50 may form part of a modular in-row cooling system. For example, FIG. 7 illustrates an exploded perspective view of an in-row cooling system 96 with a master in-row cooling unit 98 and a slave in-row cooling unit 100. The master in-row cooling unit 98 and the slave in-row cooling unit 100 can correspond to different types of the in-row cooling units 50 discussed above. The master in-row cooling unit 98 may operate independently in a row 25, or may be coupled with one or more slave in-row cooling units 100 for expanding cooling capacity.

In FIG. 7, the master in-row cooling unit 98 and the slave in-row cooling unit 100 each have open lateral sides 102 (e.g., in extending along the sides and between a front and back of the unit). The open lateral sides 102 of the slave in-row cooling unit 100 and the master in-row cooling unit 98 can include any appropriate structure for coupling with other open lateral sides 102 or panels 104. When the master in-row cooling unit 98 is used individually, removable panels 104 are mounted or attached so as to cover the open lateral sides 102 of the master in-row cooling unit 98. To add the slave in-row cooling unit 100, the panel 104 on the right in FIG. 7 is removed from the master in-row cooling unit 98. The slave in-row cooling unit 100 is coupled along that exposed open side 102 of the master in-row cooling unit 98. The removed panel 104 is placed on the slave in-row cooling unit 100, along the open lateral side 102 on the right in FIG. 7 (e.g., on the side that is opposite, not coupled with, and not abutting the master in-row cooling unit 98). The panels on either end of the assembly may enclose a shared volume within the master in-row cooling unit 98 and the slave in-row cooling unit 100.

Figure 8:
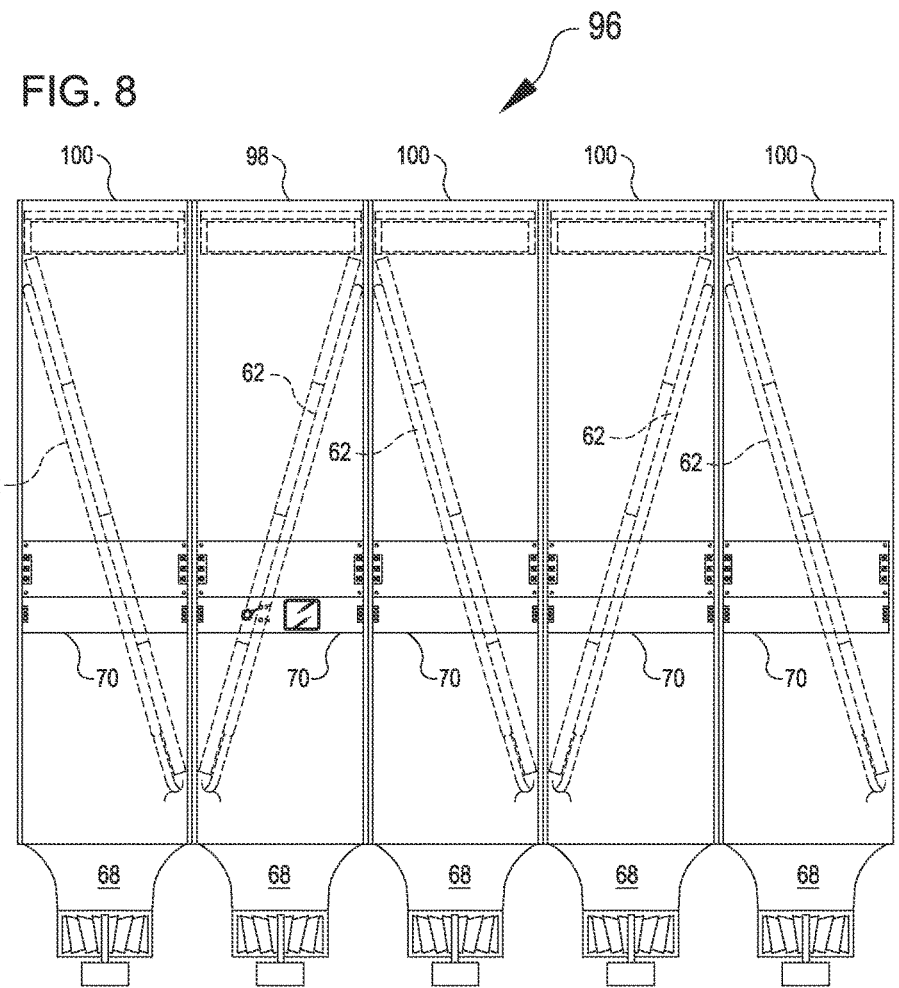
FIG. 8 is a front view of an in-row cooling system with adjoined in-row cooling units in accordance with embodiments.

Any suitable number of slave in-row cooling unit 100 can be coupled with an individual master in-row cooling unit 98. For example, FIG. 8 illustrates an example in which four slave in-row cooling unit 100 are coupled in a series with a single master in-row cooling unit 98. The slave in-row cooling unit 100 can be coupled on either side of the master in-row cooling unit 98, as may be appreciated by the one slave in-row cooling unit 100 shown on the left of the master in-row cooling unit 98 in FIG. 8 and the three slave in-row cooling unit 100 coupled to the right side of the master in-row cooling unit 98 in FIG. 8. Thus the shared volume may be the volume defined between the fronts and backs of the master in-row cooling unit 98 and the slave in-row cooling units 100, and further defined between outward-facing sides of units located at opposite ends of the assembly (e.g., where side panels 104 are attached in the completed assembly). The shared volume may permit fluid communication between components among the coupled units, such as from an intake and/or across a chilling coil 62 of one unit and through a fan 68 of another unit.

In some embodiments, a master in-row cooling unit 98 and slave in-row cooling units 100 can be combined into a shared volume that includes chilling coils 62 arranged at different orientations (e.g., slanted in different directions). Such arrangements can allow for patterns of chilling coils 62 that may provide enhanced cooling effects through the shared volume. As one example, in FIG. 8, the chilling coils 62 are arranged in a zig-zagging or "w-shaped" arrangement. However, other arrangements are also possible. For example, in some embodiments, adjacent chilling coils 62 may be slanted in the same direction and/or separated by a panel (such as the side panel 104) that keeps the adjacent chilling coils 62 separate instead of in a shared volume.

In various embodiments, the master in-row cooling unit 98 is coupled with the slave in-row cooling unit 100 for transfer of power and/or data. For example, the control module 70 of the master in-row cooling unit 98 may couple with the control module 70 of each of the slave in-row cooling units 100 (e.g., directly or via another intervening control module 70). The control modules 70 can include features described with respect to the control panel 84 shown in FIG. 6. For example, the master in-row cooling unit 98 can supply power to components of the slave in-row cooling units 100 via the power connections 86 of coupled control modules 70. As another example, the master in-row cooling unit 98 can transfer data to or from the slave in-row cooling units 100 via the data connections 88, such as to obtain information about operating parameters of components in the slave in-row cooling units 100 and/or to send signals for controlling all of the components in the assembly together to obtain a certain amount of cooling. In some embodiments, one or more slave in-row cooling units 100 may be connected with—and/or controlled by—a master in-row cooling unit 98 that is remote, e.g., that is separated by server racks 22 in the row 25 or that is located in a different row 25. For example, cables or other conduits (not shown) may be used to connect any number of slave in-row cooling units 100 to a master in-row cooling unit 98 over any intervening distance.

In some embodiments (e.g., FIG. 8), the slave in-row cooling units 100 include control modules 70 that have fewer features than the control module 70 of the master in-row cooling unit 98. For example, the master in-row cooling unit 98 shown in FIG. 8 corresponds to the control panel 84 shown in FIG. 6, and includes a user interface 90 that is not present in the control modules 70 of the slave in-row cooling units 100 in FIG. 8. Such an arrangement can allow fewer and/or simpler parts to be used and reduce costs of manufacturing parts of the in-row cooling system 96. However, in some embodiments, slave in-row cooling units 100 may also include user interfaces 90. Additionally, the slave in-row cooling unit 100 may include panels 104 that may be removed re-aligned to facilitate coupling with master in-row cooling units 98. Furthermore, although the in-row cooling system 96 in FIG. 8 includes slave in-row cooling units 100 that each have an individual fan 68, in some cases, one or more of these may be omitted, and air may be moved by fewer fans 68 through the assembly of the in-row cooling system 96. Similarly, the slave in-row cooling units 100 may have individual supply lines and/or supply valves 72 to their respective chilling coils 62, or they may alternatively couple into a supply or supply valve 72 of the master in-row cooling unit 98 when installed (e.g., the bottoms of the chilling coils 62 in FIG. 8 that are illustrated as continuing unshown may continue into a common supply line controlled by the master in-row cooling unit 98).

Figure 9:
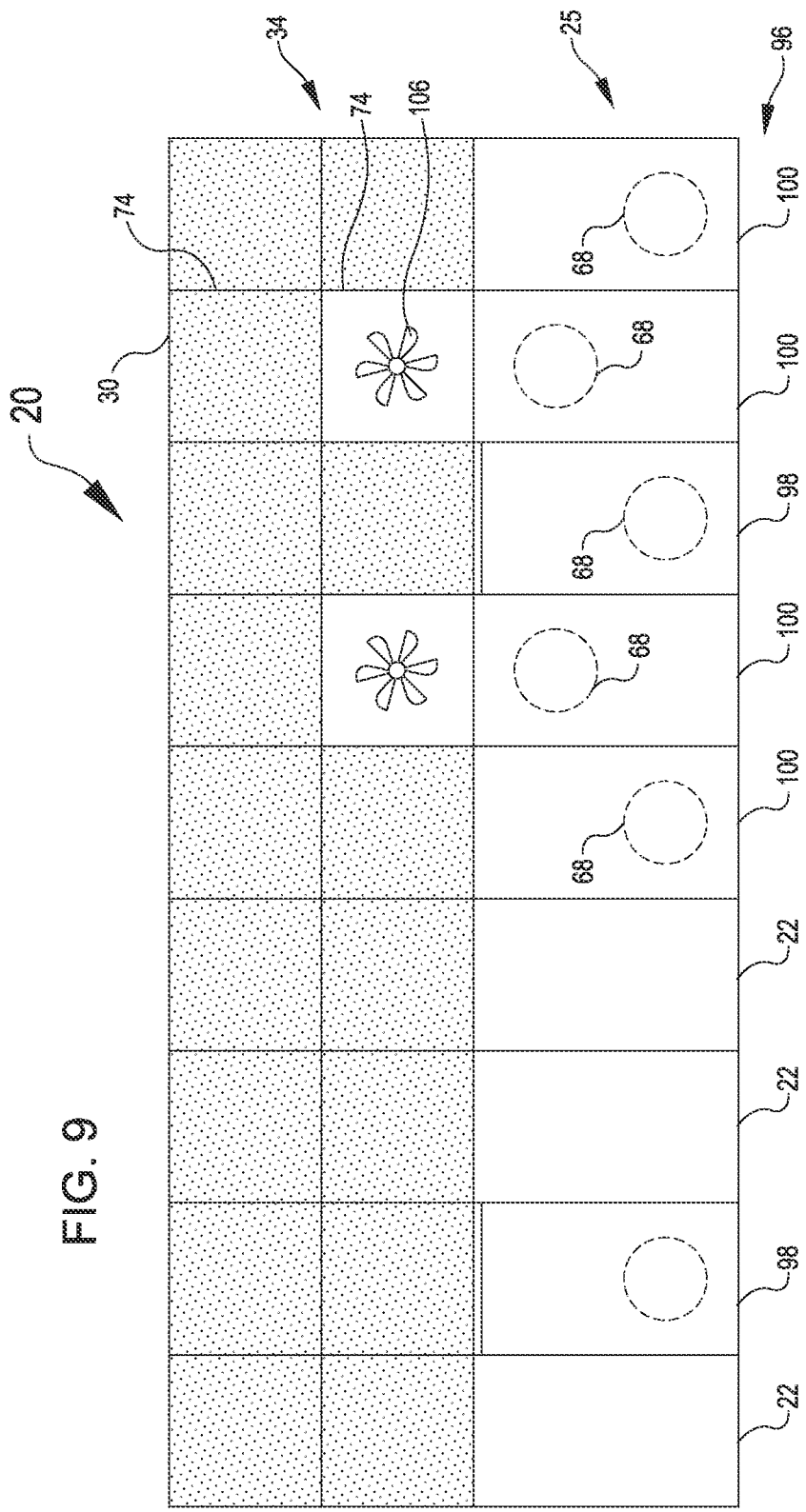
FIG. 9 is a top view diagrammatic representation of a datacenter with in-row cooling units installed in accordance with embodiments.

FIG. 9 is a top view diagrammatic representation of a data center 20. The data center 20 shown in FIG. 9 includes a row 25 having an in-row cooling system 96 installed in a row along with server racks 22. On the left of FIG. 9, a single master in-row cooling unit 98 is individually installed between server racks 22, and an assembly of slave in-row cooling unit 100 coupled with a master in-row cooling unit 98 is also installed in the same row 25 on the right side of FIG. 9. As may be appreciated from FIG. 9, in some embodiments, the fans 68 of a master in-row cooling unit 98 and slave in-row cooling units 100 may be positioned at different locations within the foot print of each respective unit. Positioning the fans 68 so as to be staggered instead of in a line may reduce an amount of turbulence experienced in the air flow provided to the datacenter.

The data center 20 in FIG. 9 also includes vanes 106 installed under tiles 74 of a cool aisle 34. The vanes 106 can be located in a flow path of fans 68 so as to disburse the flow of the fans 68, e.g., to convert velocity to pressure. This may reduce a likelihood that a suction effect will be exerted on the tiles 74 of the cold aisle 34 instead of providing airflow through the vents 30 of those tiles 74. The vanes 106 may be attached to an underside of the tile 74 or positioned separately from the tile 74. Although the vanes 106 are shown in FIG. 9 as positioned below tiles that are non-porous, the tiles 74 over the vanes 106 may alternatively be porous, e.g. like other tiles that act as vents 30. The vanes 106 may be installed as part of an installation process of the in-row cooling system 96. For example, the vanes 106 may be lowered for installation through the part of the grid 76 exposed by removal of tiles 74 for installation of in-row cooling units 50 (FIGS. 4-5).

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method of retro-fitting a datacenter having a raised floor, the raised floor being located in a room of the datacenter and comprising a network of floor tiles supported by a grid comprising tile-supporter pedestals, the method comprising:
    removing one or more floor tiles so as to produce an exposed portion of the grid including exposed tile-supporter pedestals at least partially exposed as a result of the removing the one or more floor tiles; and
    lowering a first fan in between structures of the exposed portion of the grid so as to position the first fan at least partially below the grid;
    installing a first cooling unit in the exposed portion of the grid such that a frame of the first cooling unit is supported by the exposed tile-supporter pedestals, the first cooling unit comprising a first chilling coil positioned at least partially above the raised floor as a result of the installing the first cooling unit, wherein installing the first cooling unit includes moving the frame of the first cooling unit and the first chilling coil to each be above the first fan positioned at least partially below the grid, wherein the frame of the first cooling unit is supported by the exposed tile-supporter pedestals as a result of the moving;
    connecting the first fan to a structure borne by the frame for connection for communicating at least one of power or control to the first fan; and
    installing a second cooling unit in the exposed portion of the grid, the second cooling unit comprising a second chilling coil and a second fan, wherein installing the second cooling unit includes lowering the second fan in between structures of the exposed portion of the grid so as to position the second fan at least partially below the grid and so that the first fan and the second fan are positioned at staggered distances from a front edge of a row in which the first cooling unit and second cooling unit are installed.

2. The method of claim 1, wherein the first fan is configured to move cooled air out of the first cooling unit.

3. The method of claim 1, wherein installing the first cooling unit in the exposed portion of the grid comprises lowering a supply valve in between structures of the exposed portion of the grid so as to position the supply valve at least partially below the grid, the supply valve configured to control an amount of fluid flow through the first chilling coil.

4. The method of claim 1, wherein the datacenter further includes a plurality of rows arranged along the raised floor and configured to receive server racks;
    wherein the exposed portion of the grid is in a particular row of the plurality of rows; and
    wherein the first chilling coil is positioned within the particular row when the first cooling unit has been installed.

5. The method of claim 1, further comprising arranging the frame to extend from the exposed tile-supporter pedestals to a ceiling of the datacenter and to engage a hot air plenum above the ceiling to supply input air into the first cooling unit.

6. The method of claim 1, further comprising installing one or more vanes beneath a floor tile positioned adjacent to the first cooling unit.

7. The method of claim 6, wherein the installing one or more vanes comprises attaching the one or more vanes to an underside of the floor tile positioned adjacent to the first cooling unit.

8. A method of retro-fitting a datacenter having a raised floor, the raised floor being located in a room of the datacenter and comprising a network of floor tiles supported by a grid comprising pedestals, the method comprising:

removing one or more floor tiles so as to produce an exposed portion of the grid along a front edge of a row;

installing a first cooling unit in the exposed portion of the grid, the first cooling unit comprising a first chilling coil and a first fan, wherein installing the first cooling unit includes lowering the first fan in between structures of the exposed portion of the grid so as to position the first fan at least partially below the grid; and installing a second cooling unit in the exposed portion of the grid, the second cooling unit comprising a second chilling coil and a second fan, wherein installing the second cooling unit includes lowering the second fan in between structures of the exposed portion of the grid so as to position the second fan at least partially below the grid and so that the first fan and the second fan are positioned at staggered distances set back from the front edge of the row.

9. The method of claim 8, wherein the first fan is positioned a first distance away from the front edge of the row, wherein the second fan is positioned a second distance away from the front edge of the row, wherein the second distance is greater than the first distance.

10. The method of claim 8, wherein the exposed portion of the grid includes exposed pedestals at least partially exposed as a result of the removing the one or more floor tiles, wherein the installing the first cooling unit in the exposed portion of the grid comprises installing the first cooling unit in the exposed portion of the grid such that a frame of the first cooling unit is supported by the exposed pedestals and such that the first chilling coil is positioned at least partially above the raised floor as a result of the installing the first cooling unit.

11. The method of claim 8, wherein the exposed portion of the grid includes exposed pedestals at least partially exposed as a result of the removing the one or more floor tiles, the method further comprising:

moving a first frame of the first cooling unit and the first chilling coil to each be above the first fan positioned at least partially below the grid, wherein the first frame of the first cooling unit is supported by the exposed pedestals as a result of the moving; and connecting the first fan to a structure borne by the first frame for connection for communicating at least one of power or control to the first fan.

12. The method of claim 8, wherein the exposed portion of the grid includes exposed pedestals at least partially exposed as a result of the removing the one or more floor tiles, the method further comprising connecting a supply valve from under the raised floor to the first chilling coil positioned above the first fan.

13. The method of claim 8, further comprising installing one or more vanes beneath a floor tile positioned adjacent to the first cooling unit.

14. The method of claim 8, wherein the exposed portion of the grid includes exposed pedestals at least partially exposed as a result of the removing the one or more floor tiles, the method further comprising arranging a frame of the first cooling unit to extend from the exposed pedestals to a ceiling of the datacenter and to engage a hot air plenum above the ceiling to supply input air into the first cooling unit.

15. A method of retro-fitting a datacenter having a raised floor, the raised floor being located in a room of the datacenter and comprising a network of floor tiles supported by a grid comprising pedestals, the method comprising:

removing one or more floor tiles so as to produce an exposed portion of the grid;

lowering a fan in between structures of the exposed portion of the grid so as to position the fan at least partially below the grid;

moving a frame of a cooling unit and a chilling coil within the frame to each be above the fan positioned at least partially below the grid; and electrically connecting at least one of power or control to the fan via a structure borne by the frame.

16. The method of claim 15, further comprising connecting a supply valve from under the raised floor to the chilling coil positioned above the fan.

17. The method of claim 15, wherein the exposed portion of the grid includes exposed pedestals at least partially exposed as a result of the removing the one or more floor tiles, and wherein the method further comprises:

installing the cooling unit in the exposed portion of the grid such that the frame of the cooling unit is supported by the exposed pedestals and such that the chilling coil is positioned at least partially above the raised floor as a result of the installing the cooling unit.

18. The method of claim 17, wherein the cooling unit is a first cooling unit, the chilling coil is a first chilling coil, and the fan is a first fan, wherein the method further comprises:

installing a second cooling unit in the exposed portion of the grid, the second cooling unit comprising a second chilling coil and a second fan, wherein installing the second cooling unit includes lowering the second fan in between structures of the exposed portion of the grid so as to position the second fan at least partially below the grid and so that the first fan and the second fan are positioned at staggered distances from a front edge of a row in which the first cooling unit and second cooling unit are installed.

19. The method of claim 15, further comprising installing one or more vanes beneath a floor tile positioned adjacent to the cooling unit.

20. The method of claim 15, wherein the exposed portion of the grid includes exposed pedestals at least partially exposed as a result of the removing the one or more floor tiles, the method further comprising arranging the frame to extend from the exposed pedestals to a ceiling of the datacenter and to engage a hot air plenum above the ceiling to supply input air into the cooling unit.

* * * * *

UNITED STATES PATENT AND TRADEMARK OFFICE
CERTIFICATE OF CORRECTION

| | | |
|---|---|---|
| PATENT NO. | : 10,356,956 B1 | Page 1 of 1 |
| APPLICATION NO. | : 14/746729 | |
| DATED | : July 16, 2019 | |
| INVENTOR(S) | : Alan Joseph Lachapelle and Matthew Thomas Phillips | |

It is certified that error appears in the above-identified patent and that said Letters Patent is hereby corrected as shown below:

In the Claims

Column 13, Lines 49 through 52, Claim 12:
Delete: "The method of Claim 8, wherein the exposed portion of the grid includes exposed pedestals at least partially exposed as a result of the removing the one or more floor tiles, the method further comprising connecting a supply"
Insert: -- The method of Claim 8, further comprising connecting a supply --

Signed and Sealed this
Fourteenth Day of April, 2020

Andrei Iancu
*Director of the United States Patent and Trademark Office*